United States Patent
Zhao et al.

(10) Patent No.: US 12,200,874 B2
(45) Date of Patent: Jan. 14, 2025

(54) PRESSURIZING DEVICE AND ELECTRONIC DEVICE INCLUDING PRESSURIZING DEVICE

(71) Applicants: Tyco Electronics (Shanghai) Co. Ltd., Shanghai (CN); TE Connectivity Services GmbH, Schaffhausen (CH)

(72) Inventors: Wei (David) Zhao, Shanghai (CN); Zhiqiang (Simon) Li, Shanghai (CN); Jiefeng (Lear) Zhang, Shanghai (CN); Guoxiao (Neo) Shen, Shanghai (CN); Christopher Blackburn, Bothell, WA (US)

(73) Assignees: Tyco Electronics (Shanghai) Co., Ltd., Shanghai (CN); TE Connectivity Solutions GmbH, Schaffhausen (CH)

( * ) Notice: Subject to any disclaimer, the term of this patent is extended or adjusted under 35 U.S.C. 154(b) by 27 days.

(21) Appl. No.: 17/945,500

(22) Filed: Sep. 15, 2022

(65) Prior Publication Data
US 2023/0090091 A1 Mar. 23, 2023

(30) Foreign Application Priority Data
Sep. 18, 2021 (CN) .......................... 202111103312.1

(51) Int. Cl.
*B23P 19/00* (2006.01)
*H05K 3/30* (2006.01)
*H05K 1/02* (2006.01)

(52) U.S. Cl.
CPC ............. *H05K 3/30* (2013.01); *H05K 1/0203* (2013.01)

(58) Field of Classification Search
CPC ............................... H05K 3/30; H05K 1/0203
See application file for complete search history.

(56) References Cited

U.S. PATENT DOCUMENTS

| | | | |
|---|---|---|---|
| 9,615,442 B2* | 4/2017 | Oi | H01L 23/4334 |
| 2019/0047081 A1* | 2/2019 | Kamakura | B23K 20/026 |
| 2022/0174836 A1* | 6/2022 | Wang | H05K 7/1417 |
| 2023/0093241 A1* | 3/2023 | Koizumi | H01L 33/005 |
| | | | 414/618 |

FOREIGN PATENT DOCUMENTS

CN 212662606 U * 3/2021

* cited by examiner

*Primary Examiner* — Paul D Kim
(74) *Attorney, Agent, or Firm* — Barley Snyder

(57) ABSTRACT

A pressurizing device includes a pressurizing plate having a first pressurizing plate surface and a second pressurizing plate surface opposite to each other. The first pressurizing plate surface presses an electronic element located on a first circuit board surface of a circuit board. The pressurizing device includes a plurality of peripheral pressurizing units applying pressure to a peripheral region of the second pressurizing plate surface and a plurality of central pressurizing units applying pressure to a central region of the second pressurizing plate surface.

21 Claims, 10 Drawing Sheets

PRESSURIZING DEVICE AND ELECTRONIC DEVICE INCLUDING PRESSURIZING DEVICE

CROSS-REFERENCE TO RELATED APPLICATION

This application claims the benefit of the filing date under 35 U.S.C. § 119(a)-(d) of Chinese Patent Application No. 202111103312.1, filed on Sep. 18, 2021.

FIELD OF THE INVENTION

The present disclosure relates to the field of electrical connectors, and more particularly to a pressurizing device and an electronic device including the pressurizing device.

BACKGROUND

An electronic element (e.g., an electronic chip) is usually pressed onto a circuit board or a connector on the circuit board in an electronic device by a pressurizing device, to realize electric connection between the electronic element and the circuit board or the connector by making the pins of the electronic element electrically contact the terminals of the connector or the circuit board. In the related art, the pressurizing device includes a pressurizing plate and a pressurizing unit. The pressurizing plate is used to press on the electronic element and the pressurizing unit is used to apply pressure to the pressurizing plate, thereby applying pressure to the electronic element.

The pressurizing unit, however, is usually arranged on the periphery of the pressurizing plate. This pressurization method only presses the peripheral region of the electronic element and the circuit board or the connector, but the electronic element and the circuit board or the connector (especially larger-sized electronic element and circuit board or connector) cannot obtain enough pressure in the central region thereof; this unbalanced pressure makes the mutual contact force between the pins in the central region of the electronic element and the corresponding terminals in the central region of the circuit board or the connector very small. The terminals in the central region of the circuit board produce little deflection, leading to poor electric contact between the pins in the central region of the electronic element and the corresponding terminals in the central region of the circuit board or the connector, thereby affecting the electric connection between the electronic element and the circuit board or the connector.

SUMMARY

A pressurizing device includes a pressurizing plate having a first pressurizing plate surface and a second pressurizing plate surface opposite to each other. The first pressurizing plate surface presses an electronic element located on a first circuit board surface of a circuit board. The pressurizing device includes a plurality of peripheral pressurizing units applying pressure to a peripheral region of the second pressurizing plate surface and a plurality of central pressurizing units applying pressure to a central region of the second pressurizing plate surface.

BRIEF DESCRIPTION OF THE DRAWINGS

In order to illustrate the technical solutions of the embodiments of the present disclosure more clearly, the accompanying drawings of the embodiments will be briefly described below. It should be understood that the drawings described below only relate to some embodiments of the present disclosure, rather than limiting the present disclosure, in which.

DETAILED DESCRIPTION OF THE EMBODIMENTS

In order to illustrate the objectives, technical solutions and advantages of the present disclosure more clearly, the embodiments of the present disclosure will be described in detail below with reference to the accompanying drawings. It should be understood that the following description of the embodiments is intended to explain and illustrate the general concept of the present disclosure, and should not be construed to limit the present disclosure. In the specification and drawings, the same or similar reference numbers refer to the same or similar portions or components. For the purpose of clarity, the drawings are not necessarily to scale and some well-known components and structures may be omitted from the drawings.

Unless otherwise defined, technical or scientific terms used in the present disclosure shall have the ordinary meaning as understood by one of ordinary skill in the related art to which the present disclosure belongs. The terms "first", "second" and similar terms used herein do not denote any order, quantity, or importance, but are merely used to distinguish different components. The wording "a" or "an" does not exclude a plurality. Terms "comprise" or "include" and similar words mean that the elements or things appearing before the word encompass the elements or things recited after the word and their equivalents, but do not exclude other elements or things. Diction such as "connect" or "contact" is not limited to physical or mechanical connections, but may include electric connections, whether direct connection or indirect connection. Dictions "up", "down", "left", "right", "top" or "bottom" are only used to indicate relative positional relationship. When the absolute positions of the described object change, the relative positional relationships may also change correspondingly. When an element is referred to as being "on" or "under" another element, it can be "directly on" or "directly under" the other element or interposition elements may be present.

The pressurizing device and the electronic device including the corresponding pressurizing device in each embodiment will be described in detail below with reference to the corresponding drawings.

Figure 1A:
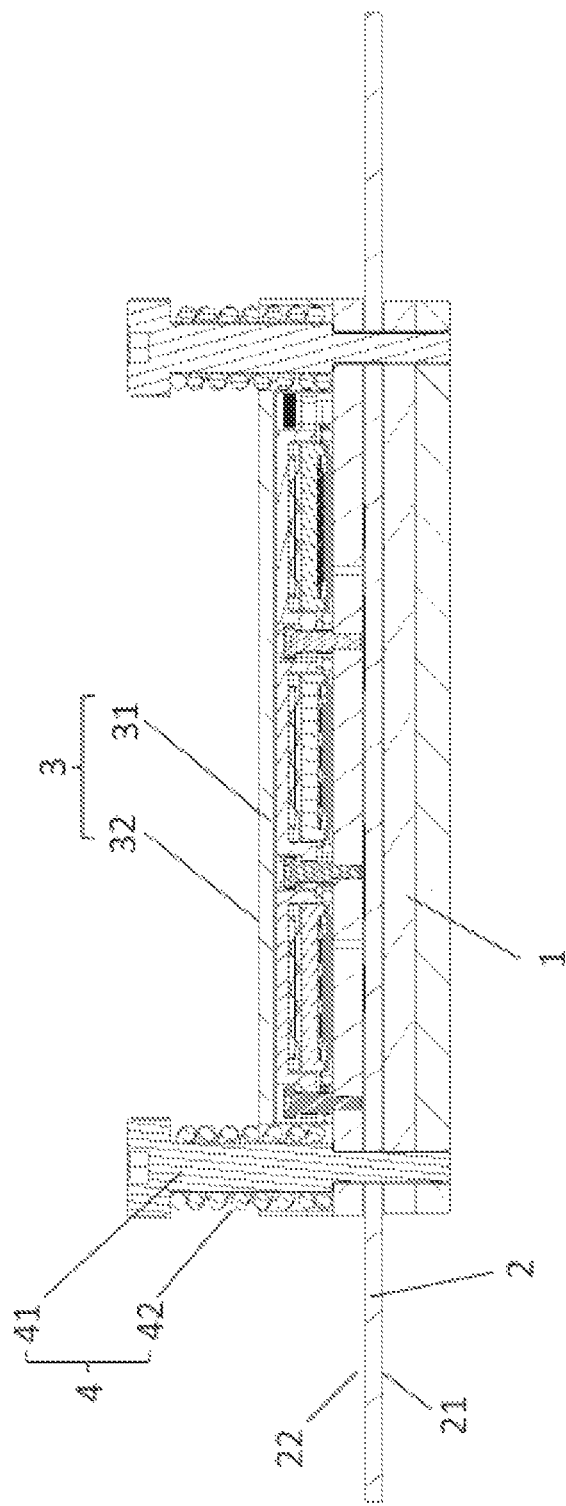
FIG. 1A is a sectional side view of a pressurizing device according to a first embodiment, in which a central pressurizing unit is omitted.
Figure 1B:
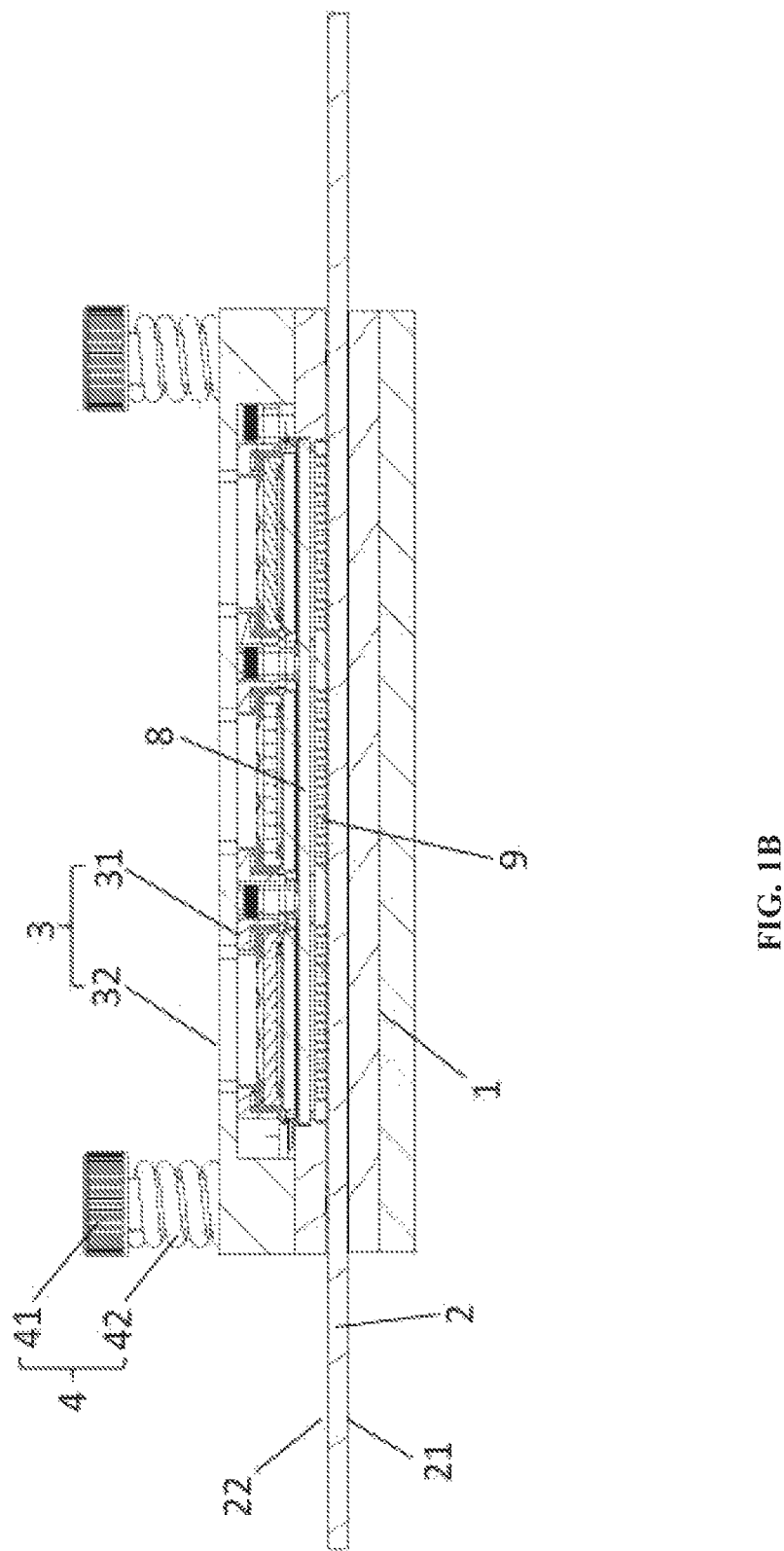
FIG. 1B is another sectional side view of the pressurizing device of FIG. 1A.

As shown in FIGS. 1A and 1B (in which the central pressurizing units 5 are omitted for the sake of clarity), the first embodiment provides a pressurizing device for applying pressure to an electronic element 8 located on a circuit board 2. The pressurizing device includes a support plate 1, a pressurizing plate 3, a plurality of peripheral pressurizing units 4 and a plurality of central pressurizing units 5, shown in FIG. 2.

The pressurizing plate 3 includes a first pressurizing plate surface 31 (i.e., the bottom surface of the pressurizing plate 3 in FIGS. 1A and 1B) and a second pressurizing plate surface 32 (i.e., the top surface of the pressurizing plate 3 in FIGS. 1A and 1B) opposite to each other. The first pressurizing plate surface 31 is used to directly or indirectly press the electronic element 8 located on a first circuit board surface 22 of the circuit board 2 (i.e., the top surface of the circuit board in FIGS. 1A and 1B). The first circuit board surface 22 is opposite to a second circuit board surface 21 (i.e., the bottom surface of the circuit board in FIGS. 1A and 1B).

The plurality of peripheral pressurizing units 4 are used to apply pressure to the peripheral region of the second pressurizing plate surface 32. The plurality of central pressurizing units 5 are used to apply pressure to the central region of the second pressurizing plate surface 32. The support plate 1 is arranged on the second circuit board surface 21 of the circuit board 2 opposite to the first circuit board surface 22 and is used to support the second circuit board surface 21.

A connector 9 may be arranged on the first circuit board surface 22; the electronic element 8 is pressed against the connector 9 by the first pressurizing plate surface 31, as shown in FIG. 1B.

As shown in FIGS. 1A and 1B, the peripheral pressurizing units 4 each include a first bolt 41 and a first compression spring 42. The threaded rod of the first bolt 41 passes through the pressurizing plate 3 from the peripheral region of the second pressurizing plate surface 32 to the support plate 1 and is threadedly connected with the support plate 1. The first compression spring 42 is axially sleeved on the threaded rod of the first bolt 41 and is squeezed between the head of the first bolt 41 and the second pressurizing plate surface 32.

Figure 2:
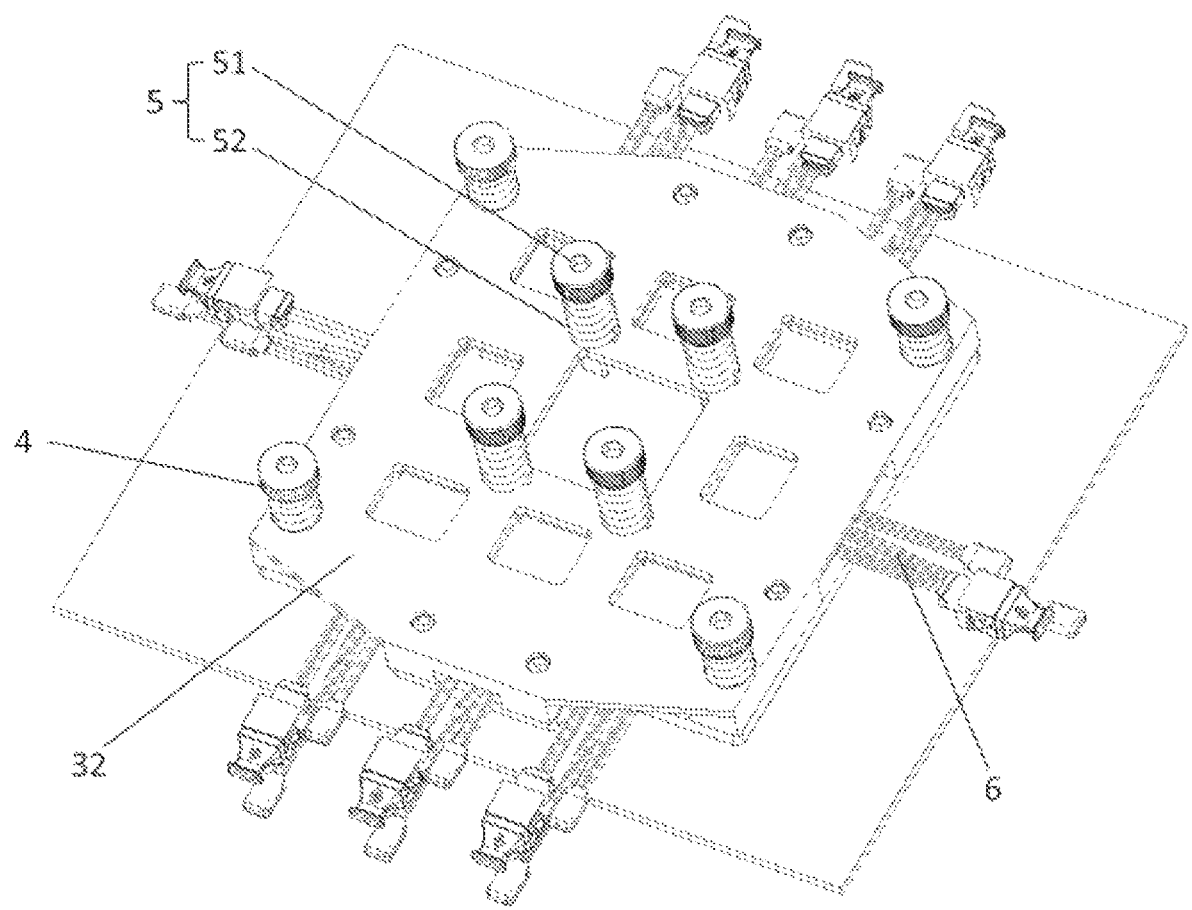
FIG. 2 is a perspective view of an electronic device according to a first embodiment.
Figure 3:
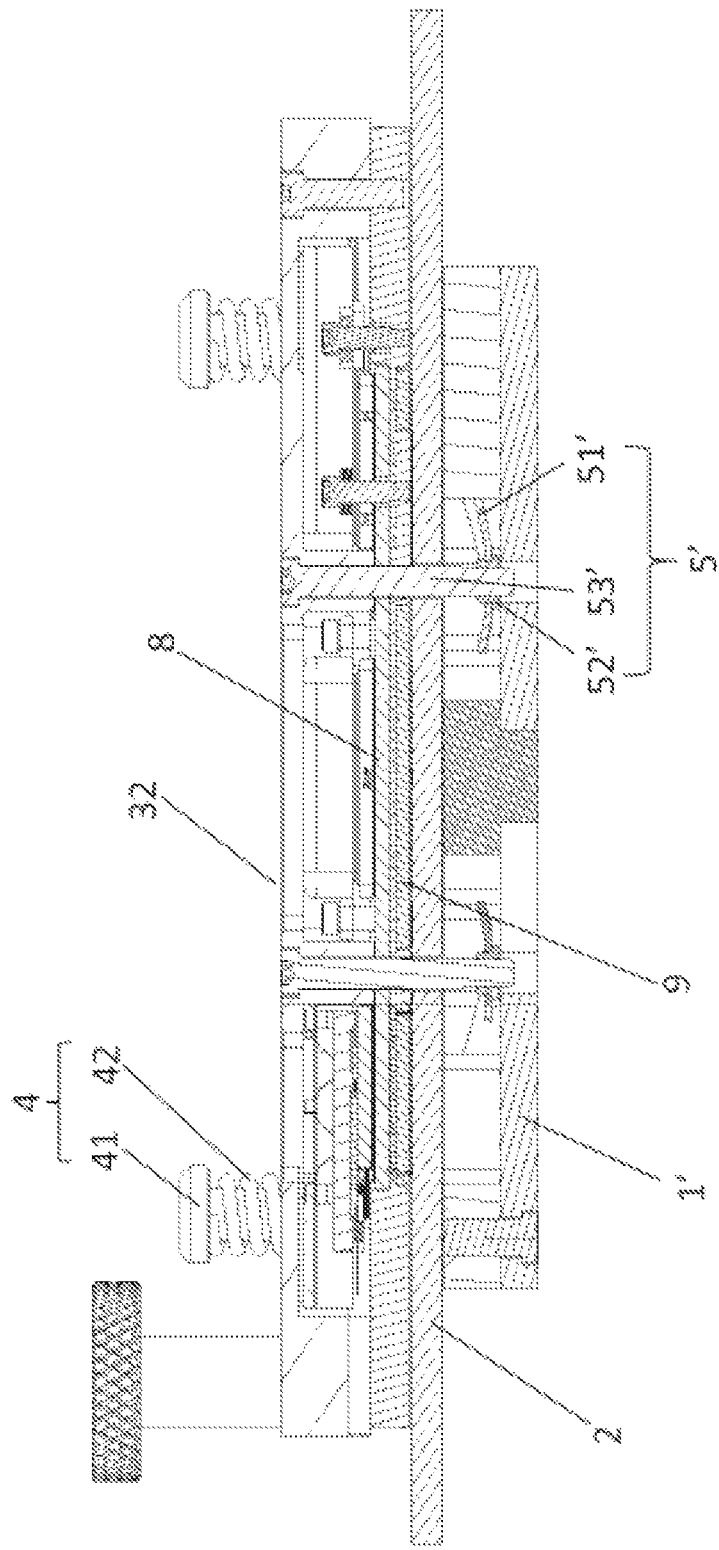
FIG. 3 is a sectional side view of a pressurizing device according to a second embodiment.

Each of the central pressurizing units 5, as shown in FIG. 2, includes a second bolt 51 and a second compression spring 52. The threaded rod of the second bolt 51 passes through the pressurizing plate 3 from the central region of the second pressurizing plate surface 32 to the support plate 1 and is threadedly connected with the support plate 1. The second compression spring 52 is axially sleeved on the threaded rod of the second bolt 51, and is squeezed between the head of the second bolt 51 and the second pressurizing plate surface 32.

Referring to FIG. 2, the central pressurizing units 5 may be identical in structure to the peripheral pressurizing units 4 to balance the loading forces in the central region and the peripheral region, or may be slightly different from the peripheral pressurizing unit 4 according to the actual situation (e.g., type or size of the bolt is slightly different). The first bolt 41 and the second bolt 51 in the present embodiment may be both shoulder screws.

In addition, as shown in FIG. 1B, the first embodiment also provides an electronic device which includes an electronic element 8, a circuit board 2 and the pressurizing device of the present embodiment. The electronic element 8 of the present embodiment may be an electronic chip or a chip processor. A cable 6 is connected to the circuit board 2, as shown in FIG. 2. The electronic element 8 is pressed against the circuit board 2 by the pressurizing device.

In addition, the electronic device of the present embodiment may further include a connector 9 arranged on the circuit board 2, as shown in FIG. 1B. The connector 9 may be fixed on the first circuit board surface 22 of the circuit board 2 by soldering. At this time, the electronic element 8 is pressed against the connector 9 by the pressurizing device.

As shown in FIG. 2, there are four peripheral pressurizing units 4 and four central pressurizing units 5 in the present embodiment. The four peripheral pressurizing units 4 are evenly distributed around the pressurizing plate 3 at intervals, and the four central pressurizing units 5 are evenly distributed in the central region of the platen 3 at intervals. The number of the peripheral pressurizing units 4 and the central pressurizing units 5, however, is not limited to this embodiment.

The pressurizing device of the present embodiment provides a plurality of the peripheral pressurizing units 4 for applying pressure to the peripheral region of the second pressurizing plate surface 32 so that the pressurizing plate 3 presses the peripheral region of the electronic element 8, and thus the mutual contact force between the pins in the peripheral region of the electronic element 8 and the corresponding terminals in the peripheral region of the circuit board 2 or connector 9 on the circuit board 2 is large, and the corresponding terminals in the peripheral region of the circuit board 2 or connector 9 on the circuit board 2 are sufficiently deflected, ensuring good electric contact is formed between the pins in the peripheral region of the electronic elements 8 and the corresponding terminals in the peripheral region of the circuit board 2 or connector 9 on the circuit board 2.

The pressurizing device also provides a plurality of the central pressurizing units 5 for applying pressure to the central region of the second pressurizing plate surface 32, so that the pressurizing plate 3 presses the central region of the electronic element 8, thus the mutual contact force between the pins in the central region of the electronic element 8 and the corresponding terminals in the central region of the circuit board 2 or the connector 9 on the circuit board 2 is large, and the corresponding terminals in the central region of the circuit board 2 or the connector 9 on the circuit board 2 are sufficiently deflected, ensuring good electric contact is formed between the pins in the central region of the electronic elements 8 and the corresponding terminals in the central region of the circuit board 2 or the connector 9 on the circuit board 2.

Therefore, the good electric contact is formed between the electronic element 8 and the circuit board 2 or the connector 9 on the circuit board 2 (even for larger size of the electronic element 8 and the circuit board 2 or the connector 9).

As shown in FIGS. 3 to 6, the second embodiment provides another pressurizing device, which is basically the same as the pressurizing device of the first embodiment, except for the central pressurizing units and the corresponding support plate.

In the second embodiment, each of the central pressurizing units 5' includes an elastic plate 51', a nut 52', and a third bolt 53'. The elastic plate 51' is fixed on the support plate 1'. The nut 52' is fixedly disposed in the elastic plate 51' and is disposed through the elastic plate 51'. The axial direction of the nut 52' is perpendicular to the plate surface of the elastic plate 51'. The threaded rod of the third bolt 53' passes through the pressurizing plate 3 from the central region of the second pressurizing plate surface 32 to the nut 52' and is threadedly connected with the nut 52'. The head of the third bolt 53' is settled in the groove of the second pressurizing plate surface 32.

Figure 6:
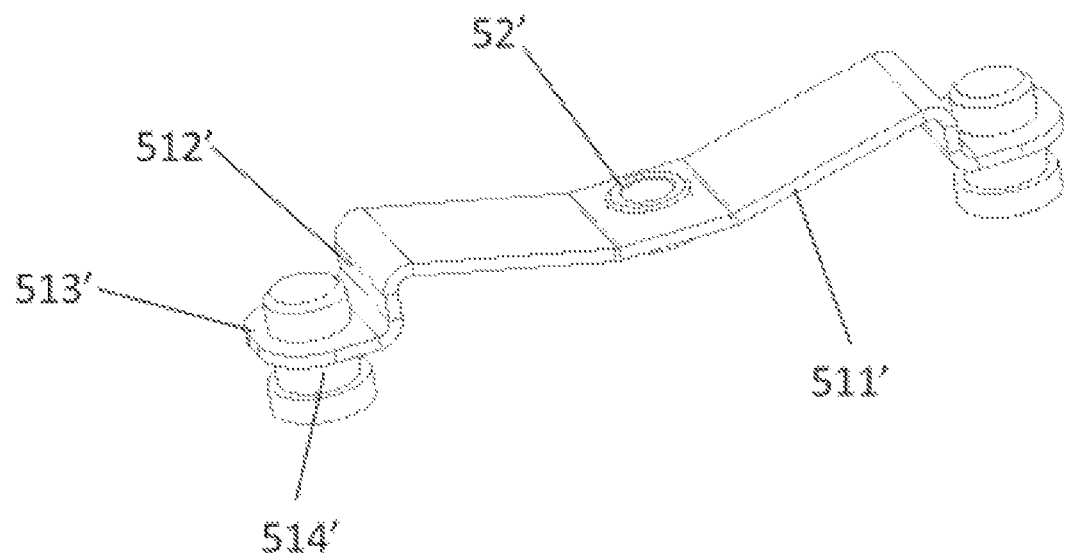
FIG. 6 is a perspective view of an elastic plate of the pressurizing device of FIG. 3.

As shown in FIG. 6, the elastic plate 51' includes an elastic plate main body 511' with elasticity. The nut 52' is fixedly disposed in the central region of the elastic plate main body 511', and the elastic plate main body 511' protrudes toward (i.e., the downward direction in FIGS. 3 and 6) the support plate 1' in a natural state, that is, the elastic plate main body 511' is concave downward in a natural state. When the third bolt 53' has a tendency to break free upward with the use of time, the elastic plate main body 511' can generate a downward pulling force on the third bolt 53', thereby preventing the third bolt 53' from breaking free upward to a certain extent, ensuring that the central pressurizing unit 5' continuously applies pressure to the central region of the second pressurizing plate surface 32 of the pressurizing plate 3 and increasing the durability of the applied pressure. Both opposite ends of the elastic plate main body 511' are bent toward the supporting plate 1', respectively, to form the supporting portion 512'. The free end of the supporting portion 512' bends from the inside to the outside along the direction substantially parallel to the supporting plate 1' (i.e., the direction in which the center of the elastic plate 51' towards the outside) so as to form a fixing portion 513'. Each of the two fixing portions 513' is fixedly connected to the supporting plate 1' by a fastener 514'. The fastener 514' can be, for example, a rivet. The elastic plate main body 511', the two supporting portions 512' and the two fixing portions 513' are integrally connected in the shown embodiment.

Figure 4:
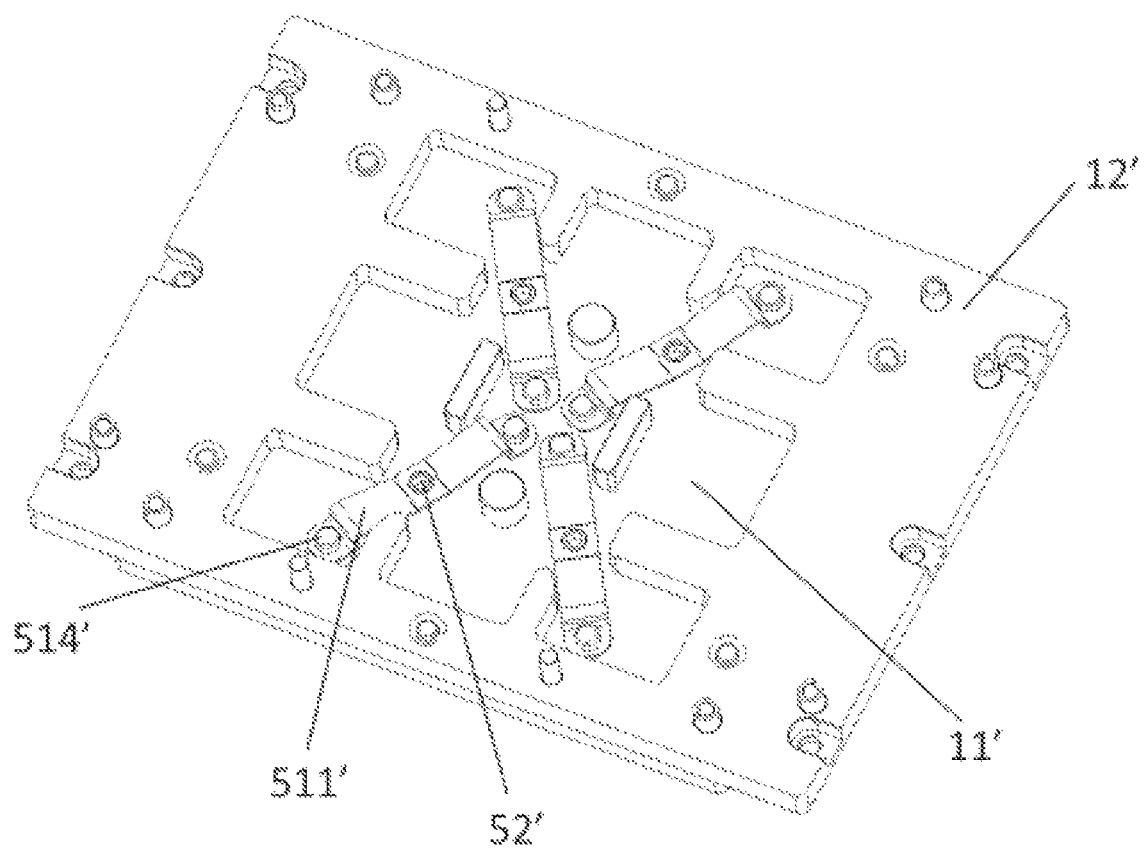
FIG. 4 is a perspective view of the pressurizing device of FIG. 3 after removing a pressurizing plate and a third bolt.
Figure 5:
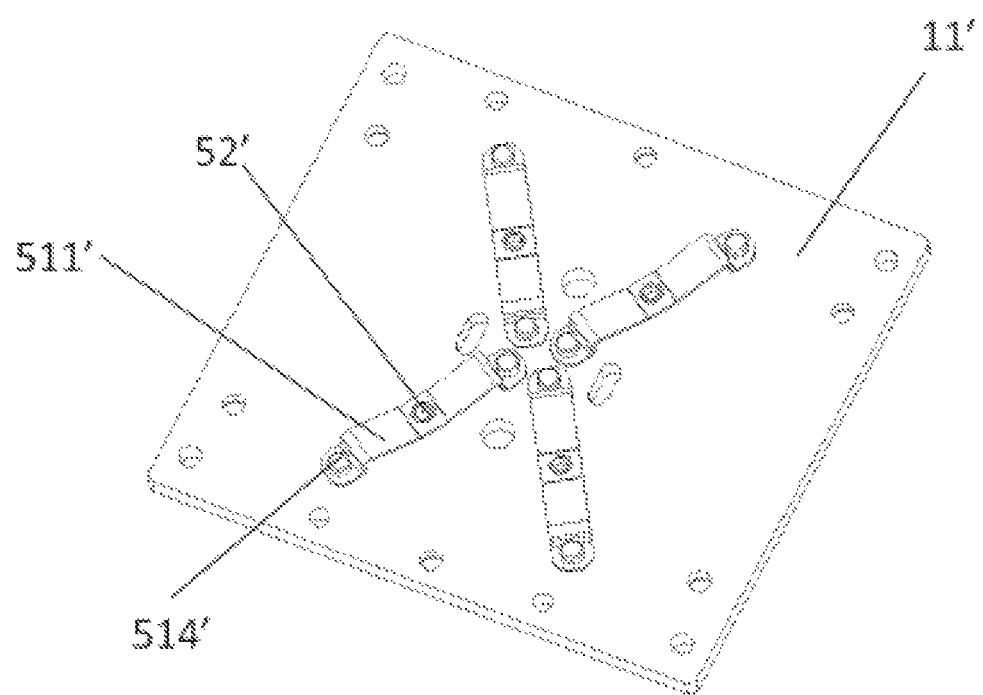
FIG. 5 is a perspective view of the pressurizing device of FIG. 3 after removing the pressurizing plate and a hollow plate of a supporting plate.

The support plate 1' of the present embodiment is also arranged on the second circuit board surface 21 of the circuit board 2 opposite to the first circuit board surface 22 and is used to support the second circuit board surface 21. The support plate 1' may be provided with a concave portion in which the elastic plate 51' may be arranged. Alternatively, as shown in FIG. 4 and FIG. 5, the support plate 1' in the present embodiment may also include a solid plate 11' and a hollow plate 12' arranged on the solid plate 11', and a hollow region is disposed in the hollow plate 12'. The elastic plate 51' can be fastened to the solid plate 11' in this hollow region. The concave portion or the hollow region provides space for the arrangement of the elastic plate 51', and also provides space for the elastic plate main body 511' to exert elastic force in the up-down direction (i.e., the direction perpendicular to the support plate). The height of the concave portion or the hollow region should be at least such that the entire elastic plate 51' is accommodated in the concave portion or the hollow region.

Figure 7:
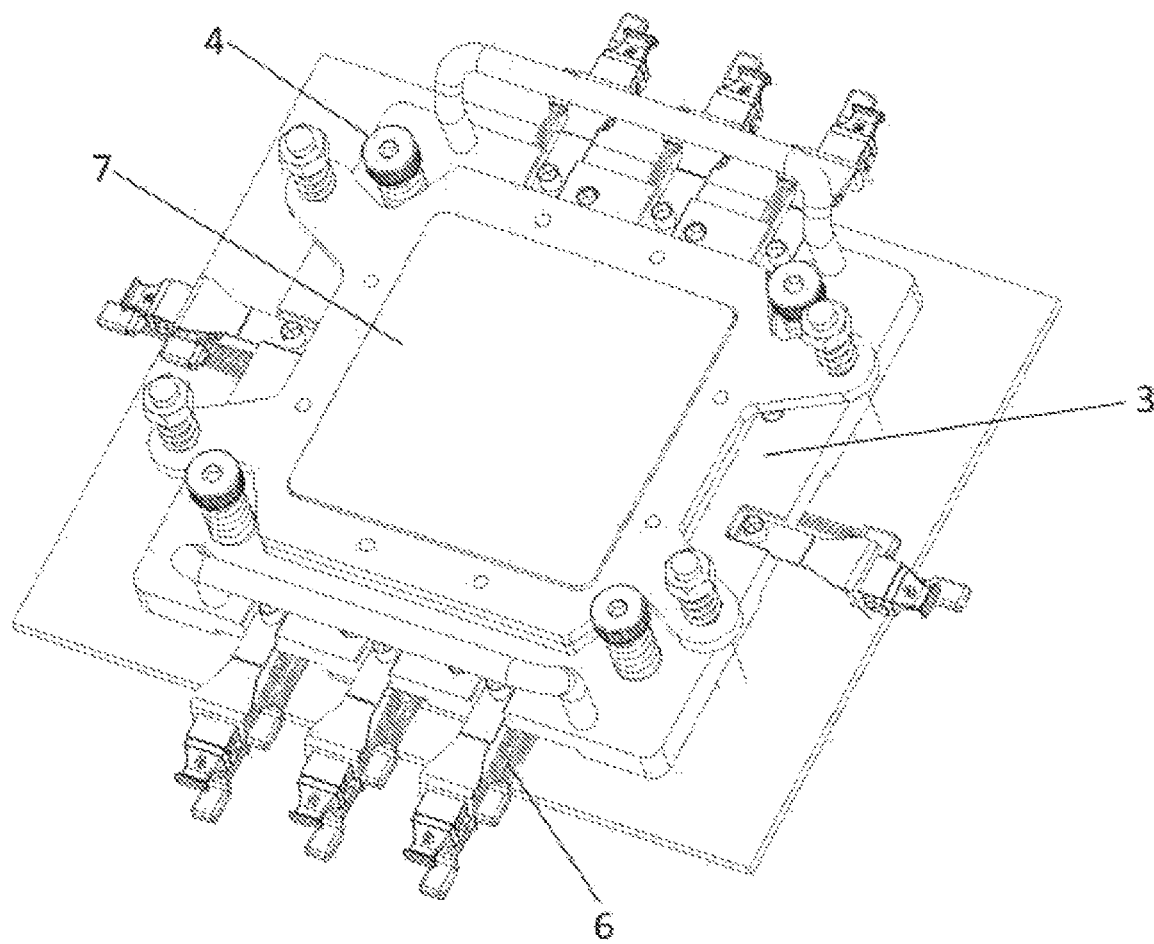
FIG. 7 is a perspective view of an electronic device according to an embodiment.
Figure 8:
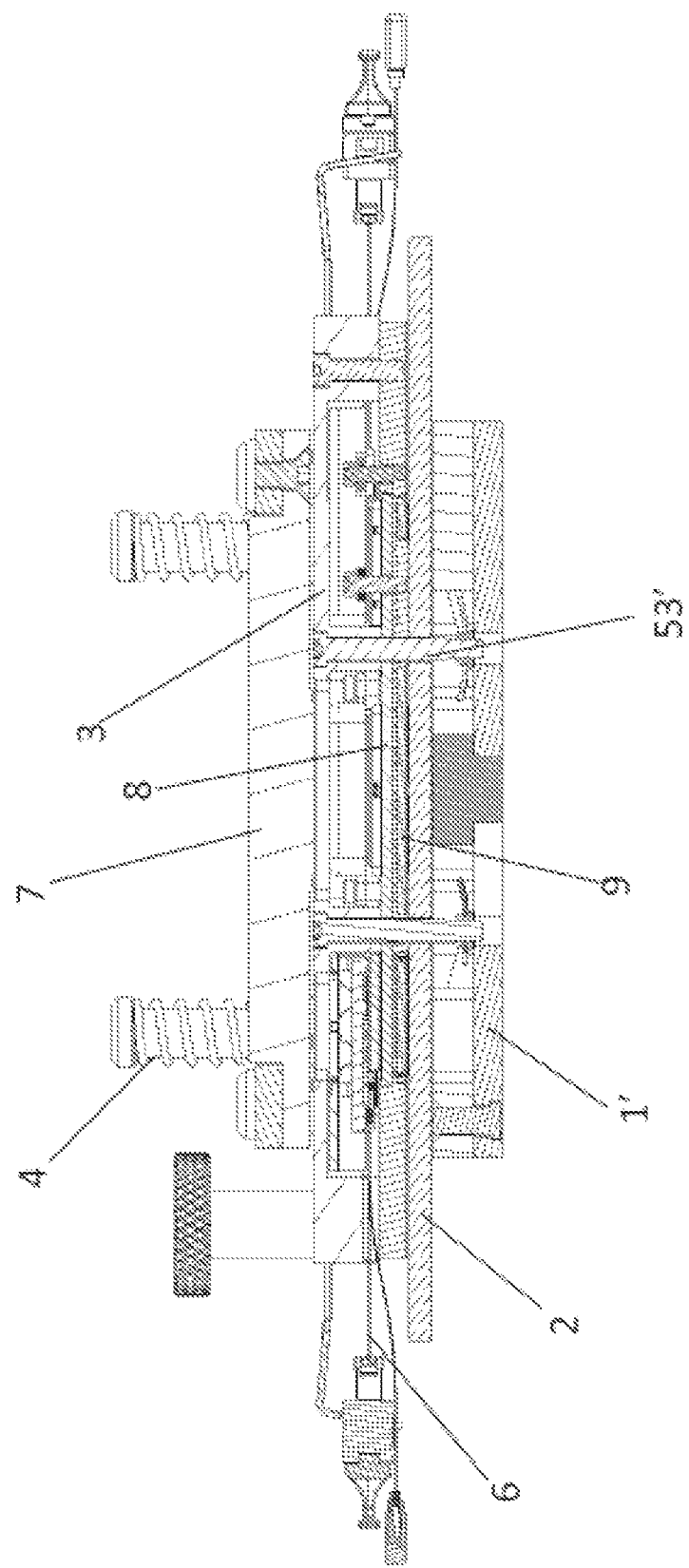
FIG. 8 is a sectional side view of the electronic device of FIG. 7.
Figure 9:
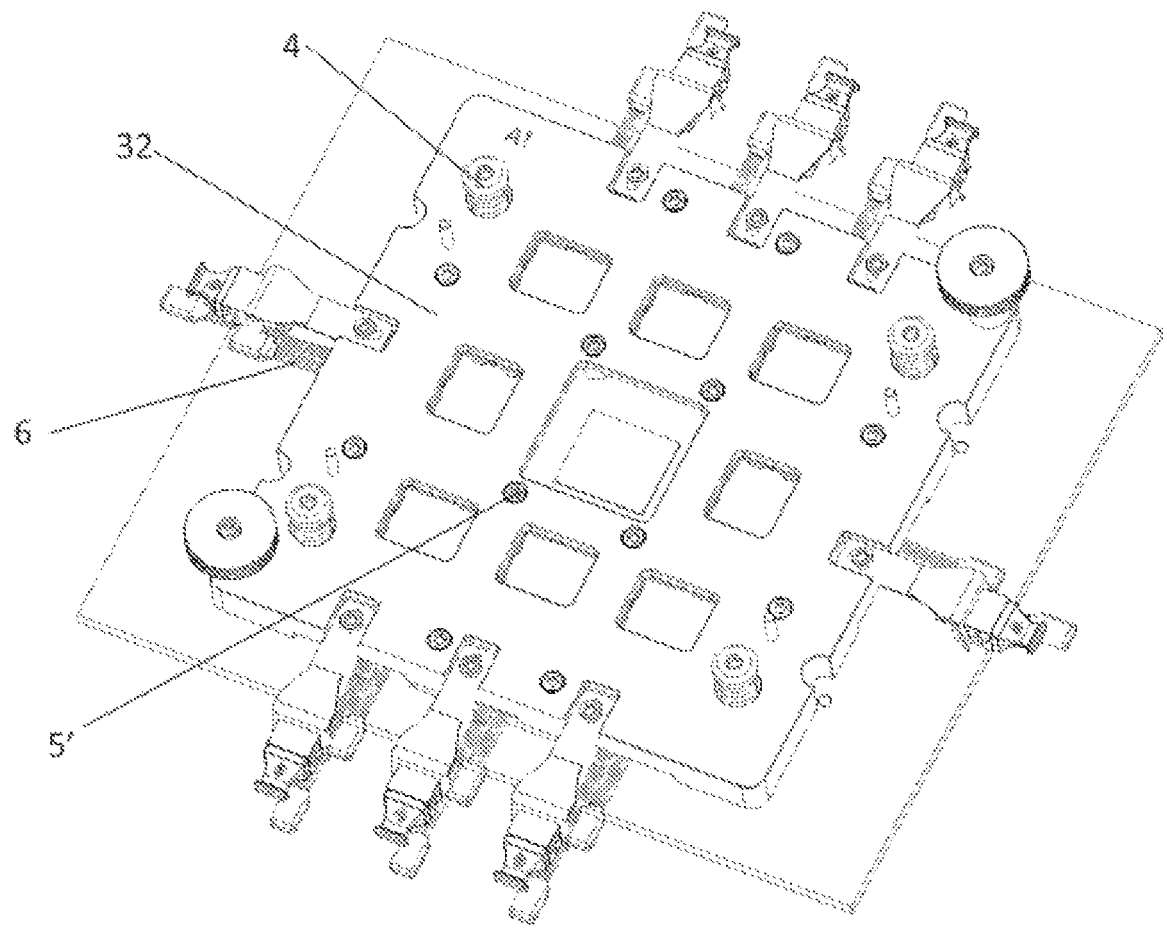
FIG. 9 is a perspective view of the electronic device of FIG. 7 after removing a cooling plate.

As shown in FIGS. 7 to 9, the second embodiment further provides another electronic device which includes an electronic element 8, a circuit board 2, a cooling plate 7 and the pressurizing device of the present embodiment. A cable 6 is connected to the circuit board 2. The electronic element 8 in the present embodiment may be an electronic chip or a chip processor. The electronic element 8 is pressed on the circuit board 2 by the pressurizing device. The cooling plate 7 is used to cool down the electronic element 8. The cooling plate 7 is arranged on the second pressurizing plate surface 32 of the pressurizing plate 3, and the cooling plate 7 can be fixed on the supporting plate 1' by fasteners as shown in FIG. 8, or by the other conventional setting manner in the field according to the customers' need.

The electronic device of the present embodiment may also include a connector 9 arranged on the circuit board 2, and the connector 9 may be fixed on the first circuit board surface 22 of the circuit board 2 by welding. At this time, the electronic element 8 is pressed against the connector 9 by the pressurizing device.

As shown in FIG. 9, there are four peripheral pressurizing units 4 and four central pressurizing units 5' in the present embodiment, and the four peripheral pressurizing units 4 are evenly distributed around the pressurizing plate 3 at intervals, and the four central pressurizing units 5' are evenly distributed in the central region of the pressurizing plate 3 at intervals. But the number of the peripheral pressurizing units 4 and the central pressurizing unit 5' is not limited to this.

The pressurizing device of the present embodiment provides a plurality of the peripheral pressurizing units 4 for applying pressure to the peripheral region of the second pressurizing plate surface 32, so that the pressurizing plate 3 presses the peripheral region of the electronic element 8, thus the mutual contact force between the pins in the peripheral region of the electronic element 8 and the corresponding terminals in the peripheral region of the circuit board 2 or connector 9 on the circuit board 2 is large, and the corresponding terminals in the peripheral region of the circuit board 2 or the connector 9 on the circuit board 2 are sufficiently deflected, ensuring good electric contact is formed between the pins in the peripheral region of the electronic element 8 and the corresponding terminals in the peripheral region of the circuit board 2 or the connector 9 of on the circuit board 2.

The pressurizing device also provides a plurality of the central pressurizing units 5' for applying pressure to the central region of the second pressurizing plate surface 32, so that the pressurizing plate 3 presses the central region of the electronic element 8, thus the mutual contact force between the pins in the central region of the electronic element 8 and the corresponding terminals in the central region of the circuit board 2 or the connector 9 on the circuit board 2 is large, and the corresponding terminals in the central region of the circuit board 2 or the connector 9 on the circuit board 2 are sufficiently deflected, ensuring good electric contact is formed between the pins in the central region of the electronic element 8 and the corresponding terminals in the central region of the circuit board 2 or the connector 9 on the circuit board 2. Therefore, good electric contact is formed between the electronic element 8 and the circuit board 2 or the connector 9 on the circuit board 2 (even for larger size of the electronic element 8 and the circuit board 2 or the connector 9).

Regarding the central pressurizing unit 5' of the present embodiment, the head of the third bolt 53' is settled in the groove of the second pressurizing plate surface 32, and the central pressurizing units 5' are wholly located between the pressurizing plate 3 and the supporting plate 1'. It can be seen that the central pressurizing units 5' of the present embodiment do not protrude on the second pressurizing plate surface 32 of the pressurizing plate 3 like the central pressurizing units 5 of the first embodiment, so that the central pressurizing units 5' of the present embodiment do not affect the arrangement of the cooling plate 7 (or other components) on the pressurizing plate 3, and thus the customer can freely choose whether or not the cooling plate 7 is arranged on the pressurizing plate 3 according to the demand for the cooling plate 7.

It should be appreciated for those skilled in this art that the above embodiments are intended to be illustrative, and not restrictive. Many modifications may be made to the above embodiments by those skilled in this art, and various features described in different embodiments may be freely combined with each other without conflicting in configuration or principle.

Although the present disclosure has been described with reference to the accompanying drawings, the embodiments disclosed in the accompanying drawings are intended to illustrate the embodiments of the present disclosure and should not be construed as a limitation of the present disclosure.

The above embodiments are only illustrative of the principles and structures of the present disclosure, and are not intended to limit the present disclosure. Those skilled in the art should understand that any changes and improvements made without departing from the general concept of the present disclosure are within the scope of the present disclosure. The protection scope of the present disclosure shall be subject to the scope defined by the claims of the present application.

What is claimed is:

1. A pressurizing device, comprising:
   a pressurizing plate having a first pressurizing plate surface and a second pressurizing plate surface opposite to each other, the first pressurizing plate surface pressing an electronic element located on a first circuit board surface of a circuit board;
   a plurality of peripheral pressurizing units applying pressure to a peripheral region of the second pressurizing plate surface; and
   a plurality of central pressurizing units applying pressure to a central region of the second pressurizing plate surface.

2. The pressurizing device of claim 1, wherein the first pressurizing plate surface presses the electronic element against a connector arranged on the first circuit board surface.

3. The pressurizing device of claim 1, further comprising a support plate arranged on a second circuit board surface of the circuit board opposite to the first circuit board surface.

4. The pressurizing device of claim 3, wherein each of the peripheral pressurizing units includes a first bolt having a threaded rod passing through the pressurizing plate from the peripheral region of the second pressurizing plate surface to the support plate and threadedly connected to the support plate.

5. The pressurizing device of claim 4, wherein each of the peripheral pressurizing units includes a first compression spring axially sleeved on the threaded rod of the first bolt and squeezed between a head of the first bolt and the second pressurizing plate surface.

6. The pressurizing device of claim 5, wherein each of the central pressurizing units includes a second bolt having a threaded rod passing through the pressurizing plate from the central region of the second pressurizing plate surface to the support plate and threadedly connected to the support plate.

7. The pressurizing device of claim 6, wherein each of the central pressurizing units includes a second compression spring axially sleeved on the threaded rod of the second bolt and squeezed between a head of the second bolt and the second pressurizing plate surface.

8. The pressurizing device of claim 5, wherein each of the central pressurizing units includes an elastic plate fixed on the support plate.

9. The pressurizing device of claim 8, wherein each of the central pressurizing units includes a nut fixedly arranged in the elastic plate and disposed through the elastic plate, an axial direction of the nut is perpendicular to a plate surface of the elastic plate.

10. The pressurizing device of claim 9, wherein each of the central pressurizing units includes a third bolt having a threaded rod passing through the pressurizing plate from the central region of the second pressurizing plate surface to the nut and threadedly connected with the nut, a head of the third bolt is settled in a groove of the second pressurizing plate surface.

11. The pressurizing device of claim 10, wherein the elastic plate has an elastic plate main body with elasticity, the elastic plate main body protrudes toward the support plate in a natural state, and the nut is fixedly disposed in a central region of the elastic plate main body.

12. The pressurizing device of claim 11, wherein opposite ends of the elastic plate main body are bent toward the support plate to form a support portion, a free end of the support portion bends from inside to outside along a direction parallel to the support plate to form a fixed portion.

13. The pressurizing device of claim 12, wherein the fixed portion connects with the support plate by a fastener.

14. The pressurizing device of claim 8, wherein the support plate has a concave portion in which the elastic plate is arranged.

15. The pressurizing device of claim 8, wherein the support plate has a solid plate and a hollow plate arranged on the solid plate, a hollow region is disposed in the hollow plate, and the elastic plate is fixed on the solid plate in the hollow region.

16. The pressurizing device of claim 1, wherein the electronic element is an electronic chip or a chip processor.

17. An electronic device, comprising:
   an electronic element;
   a circuit board; and
   a pressurizing device including a pressurizing plate having a first pressurizing plate surface and a second pressurizing plate surface opposite to each other, the first pressurizing plate surface pressing the electronic element located on a first circuit board surface of the circuit board, a plurality of peripheral pressurizing units applying pressure to a peripheral region of the second pressurizing plate surface, and a plurality of central pressurizing units applying pressure to a central region of the second pressurizing plate surface.

18. The electronic device of claim 17, further comprising a connector arranged on the circuit board, the electronic element is pressed against the connector by the pressurizing device.

19. The electronic device of claim 17, further comprising a cooling plate disposed on the second pressurizing plate surface of the pressurizing plate.

20. The electronic device of claim 19, further comprising a connector arranged on the circuit board, the electronic element is pressed against the connector by the pressurizing device.

21. A pressurizing device, comprising:
   a pressurizing plate having a first pressurizing plate surface and a second pressurizing plate surface opposite to each other, the first pressurizing plate surface pressing an electronic element located on a first circuit board surface of a circuit board;
   a plurality of peripheral pressurizing units applying pressure to a peripheral region of the second pressurizing plate surface;

a plurality of central pressurizing units applying pressure to a central region of the second pressurizing plate surface; and a support plate arranged on a second circuit board surface of the circuit board opposite to the first circuit board surface, each of the central pressurizing units includes an elastic plate fixed on the support plate.

\* \* \* \* \*